United States Patent [19]
Kennedy et al.

[11] 3,943,013
[45] Mar. 9, 1976

[54] TRIAC WITH GOLD DIFFUSED BOUNDARY

[75] Inventors: Richard W. Kennedy, Skaneateles; Edward G. Tefft, Auburn, both of N.Y.

[73] Assignee: General Electric Company, Syracuse, N.Y.

[22] Filed: Oct. 11, 1973

[21] Appl. No.: 405,490

[52] U.S. Cl. .................. 148/187; 148/175; 357/39
[51] Int. Cl.² ..................................... H01L 21/225
[58] Field of Search ............... 148/175, 187; 357/39

[56] References Cited
UNITED STATES PATENTS

| 3,275,909 | 9/1966 | Gutzwiller | 357/39 |
|---|---|---|---|
| 3,440,113 | 4/1969 | Wolley | 148/187 |
| 3,579,815 | 5/1971 | Gentry | 148/175 X |
| 3,617,398 | 11/1971 | Bilous et al. | 148/175 |
| 3,640,783 | 2/1972 | Bailey | 148/186 |
| 3,701,696 | 10/1972 | Mets | 148/175 |

Primary Examiner—L. Dewayne Rutledge
Assistant Examiner—J. M. Davis
Attorney, Agent, or Firm—R. J. Mooney; D. E. Stoner

[57] ABSTRACT

Disclosed is a bidirectional triode thyristor pellet that comprises two current conductive regions and a gate region. Gold is diffused into the boundaries between the several regions to inhibit carrier migration thereacross and thus reduce turnoff time. Also disclosed is a method of fabricating the subject thyristor pellet that permits glass passivation thereof if desired.

11 Claims, 4 Drawing Figures

GOLD CONTAINING REGION

U.S. Patent March 9, 1976 3,943,013
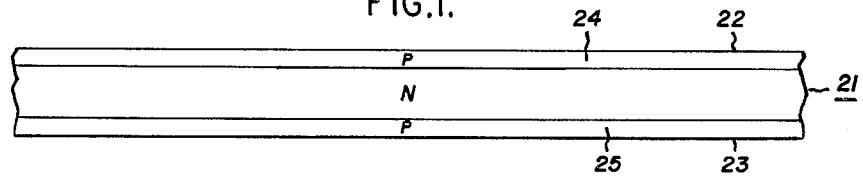
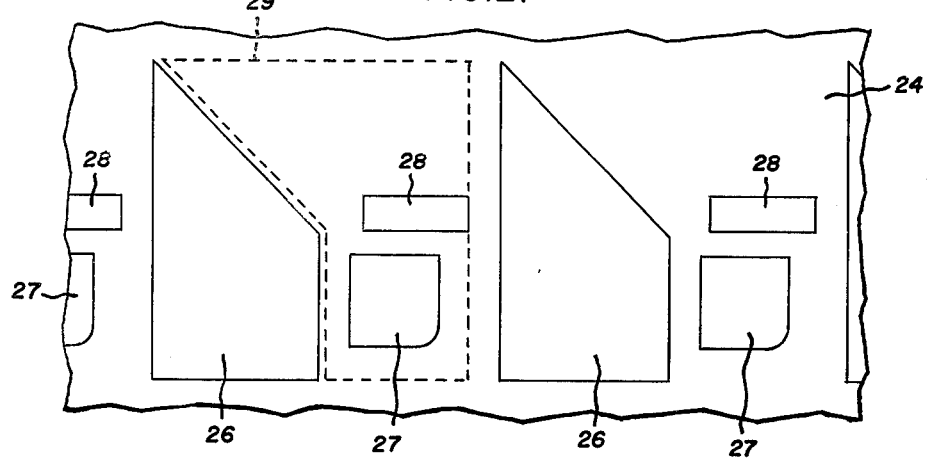
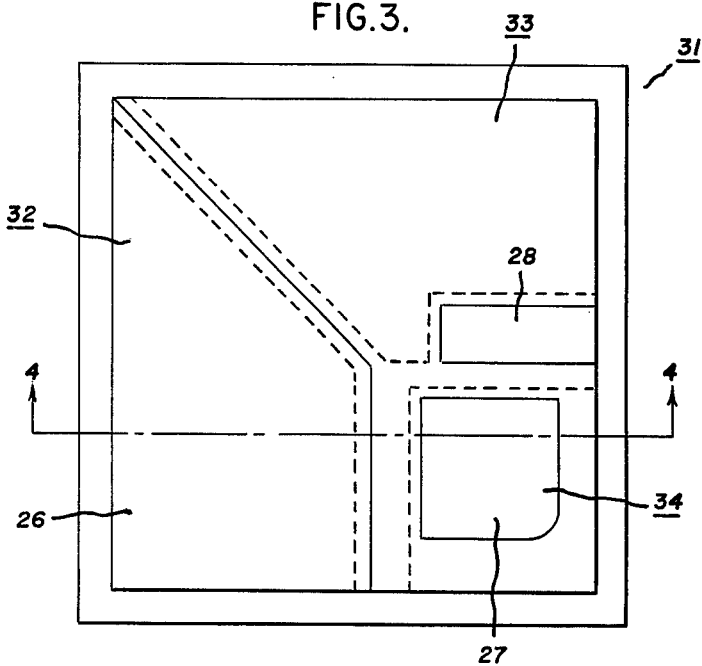
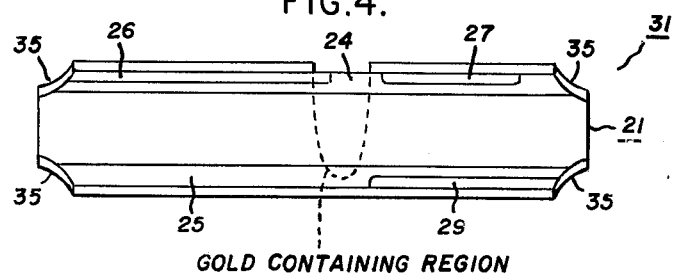

TRIAC WITH GOLD DIFFUSED BOUNDARY

BACKGROUND OF THE INVENTION

This invention relates to bidirectional triode thyristors and, more particularly, to improving commutation characteristics of triode thyristors.

Since its introduction, the bidirectional triode thyristor, or triac, has been growing in popularity among circuit designers. The reasons for this growth are evident; as a single component that can replace several components in many circuit applications, the triac can provide improvements in weight, size and cost. However, improvement is still being sought in some characteristics of triac performance. Consider, for example, the commonly used circuit in which a triac replaces two inversely connected parallel SCR's to selectively pass AC current. When using the SCR's each device has an entire half cycle in a back biased state to turn off. Thus, false firing due to the presence of mobile carriers when forward voltage is reapplied is rarely a problem. However, consider the corresponding triac circuit. One region of the triac pellet is conductive during one half cycle and another region is conductive during the following half cycle. See, for example, the SCR Manual, 5th Edition, copyright 1972 by the General Electric Co., or U.S. Pat. No. 3,275,909. Consequently, in the AC application, some portion of the triac is in a conductive state at all times except during brief periods near the crossovers of the AC input signal. If mobile charge carriers from the conductive portion "spill over" into the non-conductive portion, the non-conductive portion can be inadvertently triggered by those carriers on the reversal of the applied voltage. This effect has limited the frequencies at which triacs can be used.

It is, therefore, an object of this invention to provide a triac which resists carrier spillover from the conductive region to the non-conductive region.

SUMMARY OF THE INVENTION

This invention is characterized by a bidirectional triode thyristor pellet that is a body of semiconductor material defining two major surfaces and comprising a first conductive region for conducting current in a first direction, a second conductive region for conducting current in a second, opposite, direction and a gate region for receiving triggering signals. An auxiliary impurity that stimulates carrier recombination is diffused into the body of semiconductor material at the boundaries between these three regions for inhibiting the interregion carrier drift discussed above. As disclosed below, the auxiliary impurity can be gold and is preferably diffused into the internal layers where the depletion layer is formed. Consequently, a triac capable of operation at higher frequencies in AC applications is provided inasmuch as inadvertent triggering due to carrier spillover is prevented. Inasmuch as the gold is not covering the conductive areas but is selectively diffused, it will be appreciated that characteristics such as conducting voltage drop are not significantly affected.

A method for making the pellets is disclosed below. A wafer of semiconductor material defining two major surfaces is selectively diffused with impurities in a conventional manner to divide the wafer into a plurality of portions, each portion being properly diffused to form a triac pellet. Each pellet, of course, includes the first and second conductive regions and the gate region. One of the major surfaces of the wafer is masked, leaving exposed only the boundaries between the several regions in each pellet. One preferred method of masking that is described below includes thermally growing a layer of oxide on the wafer and etching openings over the boundaries. The auxiliary impurity, for example gold, is then diffused through the openings. A preferred diffusion process that is described below includes vapor depositing the gold over the oxide and applying heat to diffuse the impurity into the wafer to a depth at least sufficient to put gold in the interior layers. From the above brief discussion it will be apparent that the method of fabricating improved triac pellets can be practiced with conventional processing equipment.

Following diffusion, the wafers are grooved between the portions and then divided into individual pellets along the grooves. The openings in the oxide that were used during the gold diffusion step are masked at a low temperature with a material such as a lacquer or wax and photo resist techniques are used to locate the positions of the grooves. An advantage of the subject method is that the areas to be grooved and the areas immediately therearound are still covered with oxide. Thus the grooves will be well defined and can be precisely located inasmuch as they are located by openings in the oxide. Simultaneous etching of grooves on each side is performed.

If desired the grooves can be glass passivated. A preferred glass passivation process includes depositing glass in a particulate form in the grooves and then applying heat to fuse the glass. A carrier such as alcohol can be used with the particulate glass. Approximately 700° Centigrade is sufficient to fuse the glass. That is significant inasmuch as the auxiliary diffusion process takes place at approximately 800°–900° Centigrade. Thus the glass is fused at a lower temperature and the glass fusion process does not adversely affect the desired distribution of gold within the semiconductor wafer since no significant gold migration takes place at 700° Centigrade.

DESCRIPTION OF THE DRAWINGS

These and other objects and features of the present invention will become more apparent upon a perusal of the following description taken in conjunction with the accompanying drawings wherein:

FIG. 1 is an elevation view of part of a semiconductor wafer;

FIG. 2 is a plan view of the part depicted in FIG. 1 at a later stage in processing;

FIG. 3 is a plan view of a portion of the wafer at a still later stage of processing; and FIG. 4 is an elevation view of a triac pellet made in accordance with the subject method.

DESCRIPTION OF THE PREFERRED EMBODIMENT AND METHOD

Referring first to FIG. 1, there is shown a body of semiconductor material 21 that is a part of a semiconductor wafer which defines a first major surface 22 and a second major surface 23 and is approximately one to three inches in diameter as is conventional in the semiconductor art. In a preferred method of manufacture, the body 21 is initially doped to be of $n$ type conductivity and a dopant that produces $p$ type conductivity is diffused from the upper major surface 22 to create a $p$ region 24 adjacent thereto and from the lower major surface 23 to create a *p* region 25 adjacent thereto.

The wafer in effect is divided into portions by the diffusion of another impurity in a preselected distribution within each portion. A plan view of a small area of the upper major surface 22 is shown in FIG. 2. Two portions and the diffusion patterns thereon are shown. In each portion a large *n* plus type emitter 26, an *n* plus type junction gate emitter 27 and an *n* plus type conductivity control region 28 are diffused. In addition, a second *n* plus type emitter region 29 is diffused in the lower *p* type region 25. One of the second *n* plus type emitter regions 29 is shown by broken lines in FIG. 2 so that its juxtaposition can be appreciated. Only one region 29 is shown to preserve clarity. As shown more clearly in FIG. 4, the *n* plus regions 26, 27, 28 and 29 are diffused only approximately halfway through the upper *p* region 24 and lower *p* region 25. Thus, it will be appreciated that each portion of the wafer is adapted to form a triac pellet 31. If further information concerning the diffusion of triac pellets to this stage of processing is required, reference should be made to the above cited patent.

Reference is now made to FIG. 3. It will be appreciated that, as is conventional in the triac art, each portion or pellet 31 comprises a first conductive region 32 which is substantially coextensive with the first *n* plus type emitter region 26 and second conductive region 33 that is coextensive with most of the second *n* plus type emitter region 29. Furthermore, a gate region 34 is included in the vicinity of the *n* plus type junction gate emitter 27. As is well known in the triac art, when a triac is used for selectively passing AC current, the first conductive region 32 conducts during one half of the AC cycle and the second conductive region 33 conducts during the subsequent half cycle. It is, of course, carrier migration across the boundary between the regions 32 and 33 that was discussed above.

In order to prevent carrier migration the following process is employed. The first major surface 22 is selectively masked to leave exposed only the region boundaries. A convenient and efficient method of performing the masking operation is to expose the wafer to a temperature of approximately at least 1100° Centigrade to thermally grow a layer of oxide on the surfaces thereof. For the masking operation, the oxide need be on only one of the major surfaces. However, for reasons to be discussed hereinafter, the oxide is preferably grown on each of the major surfaces. Following oxide growth, a generally Y-shaped area of the oxide is removed as shown by the broken lines in FIG. 3. It should be pointed out that, of course, this Y-shaped opening is made over each of the several portions in the wafer. The opening is preferably made by conventional techniques such as etching.

An auxiliary impurity which stimulates carrier recombination is then diffused through the openings. Such impurities include, for example, gold and platinum. Thus, gold, for example, is vapor deposited on the first major surface 22. Following vapor deposition, the wafer is exposed to a temperature in the range of from 800° to 900° Centigrade. Only in the Y-shaped openings does the gold contact the semiconductor material. Thus the gold diffuses into the crystal only in the openings as shown in FIG. 4. Preferably, the temperature and time of the diffusion operation is controlled such that the gold is diffused into the interior layers. Therefore a region containing gold atoms is created at the boundaries between the first and second conductivity regions and the gate region and carrier migration across those boundaries is inhibited. The first and second conductive regions remain substantially gold free.

To complete the processing, the wafer must be divided into triac pellets. An advantageous way of providing such a division is as follows. First, the Y-shaped opening is covered with a protective coating at a relatively low temperature. For example, a wax or a lacquer can be coated over the opening. Then, by conventional techniques, such as photoresist techniques, areas where grooves are to be etched to separate the pellets are located. The grooves are preferably etched from both major surfaces, and thus the desirability of growing the oxide coating on each of the major surfaces 22 and 23 will be appreciated. The grooves are preferably etched deeply enough to intersect all the *p n* junctions.

As mentioned previously an advantage of this method is that it permits glass passivation of the pellets. If glass passivation is to be performed, the wax or lacquer should be removed from the Y-shaped opening. That is because those organic substances may release vapors during the passivation process that can have deleterious effects on the further processing. Following rhe removal of the wax, glass, in a particulate form and suspended in a carrier such as alcohol, is deposited in the grooves. The alcohol is quickly evaporated at a low temperature and then the wafer is exposed to a temperature of approximately 700° Centigrade. At that temperature the glass fuses forming a passivation layer 35 in the grooves. It will be appreciated that the 700° temperature used during the passivation step is lower than the temperature required to mobilize the gold atoms. Thus, the distribution of gold that was previously created is not disturbed.

Following the glass passivation process, the wafer is divided along the grooves to form the pellets 31 as shown in FIGS. 3 and 4. This division is by conventional techniques.

Thus there has been developed a triac pellet with gold diffused along the boundaries between the first and second conductive regions and the gate region. Consequently, carrier migration across those boundaries is prevented. Furthermore, it has been shown that the process is entirely compatible with glass passivation techniques.

Many modifications and variations of the subject invention will be obvious to those skilled in the art. For example, it is felt that the primary need for the gold is at the boundary between the first and second conductive regions 32, 33. Thus gold diffusion only along the boundary therebetween will result in a substantially improved device. Consequently, the true scope and spirit of the invention is only as defined by the following claims.

What is claimed is:

1. A method for fabricating a plurality of bilateral thyristor pellets on a single wafer comprising the steps of:

providing a wafer of semiconductor material defining two major surfaces and selectively diffused with impurities so as to form a plurality of portions, each portion comprising a first conductive region and a second conductive region;

applying a mask to one of said major surfaces, wherein said mask defines openings at the boundaries between said first conductive regions and said second conductive regions;

diffusing an auxiliary impurity through said openings, wherein said auxiliary impurity stimulates carrier recombination at said boundaries;

masking said openings at a temperature low enough that no significant migration of said auxiliary impurity takes place;

forming new openings in said mask where intersecting grooves that will separate said portions are to be formed;

forming grooves in said new openings;

coating said grooves with glass; and subdividing said wafer between said portions.

2. A method according to claim 1 wherein said step of applying a mask comprises the steps of thermally growing a layer of oxide on said one major surface and selectively removing the portions of said layer of oxide that overlie said boundaries.

3. A method according to claim 2 wherein said step of diffusing an auxiliary impurity comprises vapor depositing said auxiliary impurity on said semiconductor material.

4. A method according to claim 1 wherein said step of coating said grooves comprises depositing said said glass in said grooves in a particulate form and applying heat to fuse said glass.

5. A method according to claim 4 wherein said step of thermally growing a layer of oxide is carried out at a temperature of above approximately 1100° Centigrade and said step of diffusing an auxiliary impurity is carried out at approximately 800°–900° Centigrade and said step of applying heat to fuse said glass is carried out at approximately 700° Centigrade.

6. A method according to claim 1 wherein said auxiliary impurity is gold.

7. A method according to claim 1 wherein each of said portions comprises a gate region at least partially bounded by said first conductive region and said second conductive region and wherein said mask defines openings at the boundaries between said gate region and said first conductive region and said second conductive region.

8. A method according to claim 1 wherein said step of masking said openings comprises covering said openings with a low temperature coating selected from the group consisting of lacquer and wax.

9. A method according to claim 8 wherein said step of forming new opening comprises the substeps of selectively applying photoresist and etching said new openings.

10. A method according to claim 9 wherein said step of applying a mask comprises the steps of thermally growing a layer of oxide on said one major surface and selectively removing the portions of said layer of oxide that overlie said boundaries.

11. A method according to claim 10 wherein said step of coating said grooves comprises depositing said glass in said grooves in a particulate form and applying heat to fuse said glass.

* * * * *